(12) United States Patent
Nagahiro

(10) Patent No.: US 9,119,297 B2
(45) Date of Patent: Aug. 25, 2015

(54) ELECTRONIC COMPONENT ELEMENT HOUSING PACKAGE

(71) Applicant: Nippon Steel & Sumikin Electronics Devices Inc., Yamaguchi (JP)

(72) Inventor: Masanori Nagahiro, Yamaguchi (JP)

(73) Assignee: Nippon Steel & Sumikin Electronics Devices Inc., Yamaguchi (JP)

( * ) Notice: Subject to any disclaimer, the term of this patent is extended or adjusted under 35 U.S.C. 154(b) by 0 days.

(21) Appl. No.: 13/874,950

(22) Filed: May 1, 2013

(65) Prior Publication Data

US 2013/0240262 A1    Sep. 19, 2013

Related U.S. Application Data

(63) Continuation of application No. PCT/JP2011/075109, filed on Oct. 31, 2011.

(30) Foreign Application Priority Data

Nov. 1, 2010    (JP) ................................ 2010-244975

(51) Int. Cl.
*B32B 9/00*    (2006.01)
*H05K 5/02*    (2006.01)
(Continued)

(52) U.S. Cl.
CPC .. *H05K 5/02* (2013.01); *B22F 3/22* (2013.01); *B22F 7/06* (2013.01); *C04B 35/119* (2013.01); *C04B 37/021* (2013.01); *C22C 32/0031* (2013.01); *C22C 32/0089* (2013.01); *H01L 23/057* (2013.01); *H01L 23/49822* (2013.01); *C04B 2235/3206* (2013.01); *C04B 2235/3208* (2013.01); *C04B 2235/3225* (2013.01); *C04B 2235/3246* (2013.01); *C04B 2235/3262* (2013.01); *C04B 2235/3263* (2013.01);
(Continued)

(58) Field of Classification Search
None
See application file for complete search history.

(56) References Cited

U.S. PATENT DOCUMENTS 5,002,909 A * 3/1991 Montino et al. .............. 501/105
5,032,555 A * 7/1991 Yamanis et al. ............. 501/105
(Continued)

FOREIGN PATENT DOCUMENTS

CN      1413073 A       4/2003
JP      05-238857 A     9/1993
(Continued)

OTHER PUBLICATIONS

International Search Report issued in PCT/JP2011/075109, mailing date Nov. 29, 2011 (1 page).

*Primary Examiner* — Humera Sheikh
*Assistant Examiner* — Seth Dumbris
(74) *Attorney, Agent, or Firm* — Nakanishi IP Associates, LLC

(57) ABSTRACT

An electronic component element housing package is produced by firing a ceramic substrate for housing an electronic component element and a metal layer for bonding to the ceramic substrate to form an electrical path, simultaneously in a reducing atmosphere. The ceramic substrate comprises alumina ($Al_2O_3$), a partially stabilized zirconia by forming solid solution with yttria ($Y_2O_3$) and a sintering agent. The sintering agent comprises magnesia (MgO), and at least 1 type selected from silica ($SiO_2$), calcia (CaO), or manganese oxides (MnO, $MnO_2$, $Mn_2O_3$, $Mn_3O_4$).

3 Claims, 1 Drawing Sheet

(51) Int. Cl.
*H01L 23/057* (2006.01)
*H01L 23/498* (2006.01)
*C04B 35/119* (2006.01)
*C04B 37/02* (2006.01)
*B22F 3/22* (2006.01)
*B22F 7/06* (2006.01)
*C22C 32/00* (2006.01)
*H01L 23/10* (2006.01)
*H01L 23/15* (2006.01)

(52) U.S. Cl.
CPC . *C04B2235/3265* (2013.01); *C04B 2235/3267* (2013.01); *C04B 2235/3418* (2013.01); *C04B 2235/96* (2013.01); *C04B 2237/343* (2013.01); *C04B 2237/403* (2013.01); *H01L 23/10* (2013.01); *H01L 23/15* (2013.01); *H01L 23/49866* (2013.01); *H01L 2224/32225* (2013.01); *H01L 2224/48227* (2013.01); *H01L 2224/73265* (2013.01); *H01L 2924/09701* (2013.01)

(56) References Cited

U.S. PATENT DOCUMENTS

| | | | | |
|---|---|---|---|---|
| 5,147,833 | A * | 9/1992 | Manning et al. | 501/105 |
| 5,675,181 | A * | 10/1997 | Nishiura et al. | 257/701 |
| 6,316,116 | B1 * | 11/2001 | Nakamura et al. | 428/469 |
| 6,733,871 | B2 * | 5/2004 | Makino | 428/210 |
| 7,172,984 | B2 * | 2/2007 | Zolnier et al. | 501/134 |
| 2003/0148138 | A1 | 8/2003 | Makino | |
| 2006/0063661 | A1 * | 3/2006 | Cohen | 501/105 |
| 2006/0175584 | A1 * | 8/2006 | Kwon et al. | 252/520.2 |
| 2009/0247390 | A1 * | 10/2009 | Nawa et al. | 501/105 |
| 2012/0252656 | A1 * | 10/2012 | Kuntz et al. | 501/135 |

FOREIGN PATENT DOCUMENTS

| | | |
|---|---|---|
| JP | 06-013481 A | 1/1994 |
| JP | 07-038014 A | 2/1995 |
| WO | 2010/114126 A1 | 10/2010 |

* cited by examiner

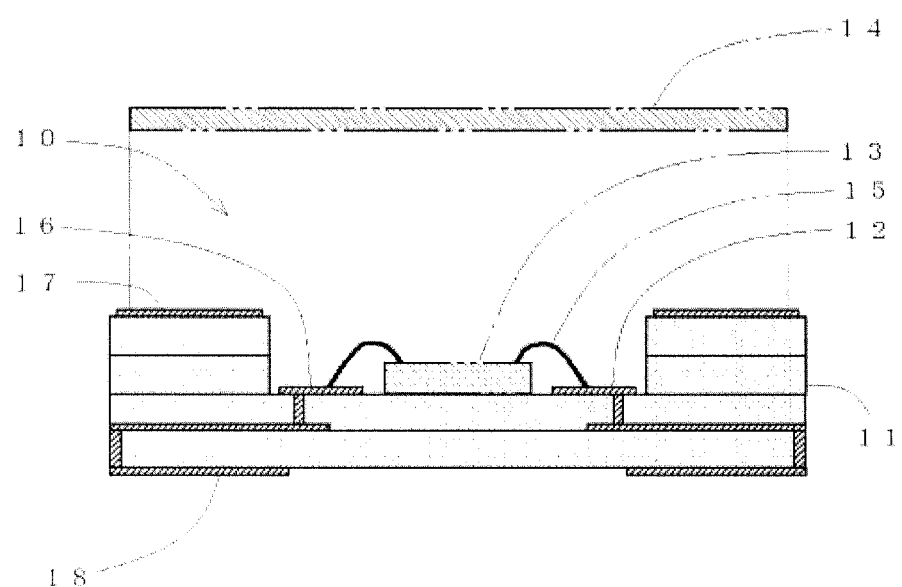

ELECTRONIC COMPONENT ELEMENT HOUSING PACKAGE

CROSS-REFERENCE TO RELATED APPLICATIONS

This application is a continuation application of International Patent Application No. PCT/JP2011/075109 filed on Oct. 31, 2011, which claims priority to Japanese Patent Application No. 2010-244975 filed on Nov. 1, 2010 in Japan.

BACKGROUND OF INVENTION

1. Field of the Invention

The present invention relates to a layered ceramic electronic component element housing package for mounting and housing semiconductor elements, liquid crystal oscillators, and other electronic component elements, and more specifically, to a smaller and lower-profile electronic component element housing package capable of reducing the size and thickness of the ceramic substrate in order to house electronic component elements in a package and reduce the thickness and size of the device on which the elements are mounted.

2. Background Art

Conventionally, a plurality of ceramic green sheets was used in layered ceramic electronic component element housing packages. The ceramic green sheets were made by adding a sintering agent such as silica ($SiO_2$), magnesia (MgO), or calcia (CaO) at the rate of 6-9% by weight to 91-94% by weight of alumina ($Al_2O_3$), mixing in an organic binder, a plasticizer, and a solvent or the like to make a slurry, which is then formed into a sheet shape by the doctor blade method. On the respective ceramic green sheets, metalized printed wiring for electrical conduction use having a via conductor and a through hole conductor for forming an electrically conductive state between layers above and below is formed by screen printing using a conductive paste made by mixing high-melting point metals such as tungsten (W) and molybdenum (Mo) with a solvent or the like. In addition, the plurality of ceramic green sheets on which the metalized printed wiring is formed is layered by aligning and applying heat and pressure, then simultaneously firing the ceramic green sheets with high-melting point metal at a temperature of 1550-1600° C. in a reducing atmosphere to form a layered ceramic electronic component element housing package having a ceramic substrate surface, an interior, and inter-layer metalized layers. This electronic component element housing package is configured so that the sintering temperature of the sheets is lowered by adding the sintering agent to the sheets, thus making it possible to perform sintering without any difficulty for sintering with the tungsten and molybdenum. In addition, the electronic component element housing package is configured so that the ceramic constituent material in the ceramic substrate other than the 91-94% by weight of alumina powder is a sintering agent such as silica ($SiO_2$), calcia (CaO), or magnesia (MgO), and is configured so that the bond strength of the metalized layers of tungsten and molybdenum formed on the ceramic substrate can be increased by the glass component of the sintering agent.

However, electronic component element housing package of mainly alumina as described above contains a comparatively large amount of sintering agent at 6-9% by weight. While the firing temperature can be lowered, the bending strength of the ceramic substrate itself drops to around 320 MPa. Thus, there is a limit to which the thickness of the ceramic substrate can be reduced. Consequently, if the thickness of the ceramic substrate is reduced, the electronic component element housing package becomes unable to withstand thermal stress during metal cover bonding after electronic component mounting. In addition, if the thickness is increased, after the electronic components are mounted this electronic component element housing package becomes unable to be used as a small, low-profile package capable of being mounted on module capable of supporting thinner and smaller sizes.

A disclosure has been made of an invention in which a sintered body is formed containing 2.0-27.0% by weight of zirconium oxide on at least one of the ceramic substrate or the cover in order to increase the bend strength of ceramic substrates in conventional electronic component element housing packages (for example, see Patent Document 1). According to this invention, a container having a ceramic substrate and a cover seals semiconductor elements airtight inside the container, and after a semiconductor device is rendered, the airtight seal can be maintained completely even if outside force is applied to the ceramic substrate or the cover.

In addition, an invention has been disclosed in which a ceramic substrate having improved bending strength for use as a semiconductor device is made from a sintered body with alumina as the main constituent element and zirconia added. The material composition of the ceramic substrate is selected from within a range of 70-90% by weight for alumina and 10-30% by weight for the zirconia additive (for example, see Patent Document 2). According to this invention, the ceramic substrate has a higher bending strength and pliability (toughness) than those made of alumina, thus making a thinner ceramic substrate possible.

CITED REFERENCE

Patent Document 1: Unexamined Japan Patent H6-13481
Patent Document 2: Unexamined Japan Patent H7-38014

However, the conventional electronic component element housing package described above has the following problems.

(1) The electronic component element housing package disclosed in Patent Document 1 is bonded with low-melting point glass as a seal with a lead terminal sandwiched between a ceramic substrate on which the electronic component elements are mounted and a cover, and differs completely from a package having a layered structure in which metal layers are formed in the ceramic substrate by simultaneous firing in a reducing atmosphere. For example, although it was possible to increase the bending strength by using a sintered body of alumina with added zirconia for at least one or the other of the ceramic substrate or the cover, it was not possible to obtain a package in which both the bending strength of the ceramic substrate was increased and the bond strength of the metal layers on the ceramic substrate was increased.

(2) The electronic component element housing package disclosed in Patent Document 2 uses the direct bonding method using the melting point of copper to bond copper sheets to the ceramic substrate, and differs completely from a package having a layered structure in which metal layers are formed on the ceramic substrate by simultaneous firing in a reducing atmosphere. For example, although it was possible to increase the bending strength by using a sintered body of alumina with added zirconia for at least one or the other of the ceramic substrate or the cover, it was not possible to obtain a package in which both the bending strength of the ceramic substrate was increased and the bond strength of the metal layers on the ceramic substrate was increased.

SUMMARY OF INVENTION

One or more embodiments of the claimed invention provide an electronic component element housing package capable of increased bending strength of the ceramic substrate and capable of securing greater bond strength of the metalized layers formed by simultaneous firing with the ceramic substrate. Further, one or more embodiments of the claimed invention provide an electronic component element housing package in which, in addition to the effect described above, the reflection rate of visible light is high on the surface of the ceramic substrate.

In a first embodiment of the claimed invention, in an electronic component housing package wherein a ceramic substrate for housing an electronic component element and a metalizing layer for bonding to the ceramic substrate to form an electrical path are simultaneously fired in a reducing atmosphere, the ceramic substrate includes alumina ($Al_2O_3$), partially stabilized zirconia by forming solid solution with yttria ($Y_2O_3$) and a sintering agent; the sintering agent comprises magnesia (MgO), and at least 1 type selected from silica ($SiO_2$), calcia (CaO), or manganese oxides (MnO, $MnO_2$, $Mn_2O_3$, $Mn_3O_4$). The content level of the partially stabilized zirconia in the ceramic substrate is within a range of 10-30% by weight. The content level of the sintering agent in the ceramic substrate is within a range of 1.5-4.5% by weight, and the residual portion other than the partially stabilized zirconia and the sintering agent in the ceramic substrate is the alumina. The metal layer includes tungsten (W), molybdenum (Mo), and a ceramic component having glass and alumina; the content level of the tungsten in the metal layer is within a range of 70-94% by weight; the content level of the molybdenum in the metal layer is within a range of 3-20% by weight; the content level of the ceramic component in the metal layer is within a range of 3-20% by weight, and at least 60% of zirconia crystals in the ceramic substrate after firing is in tetragonal phase.

In a second embodiment of the claimed invention, in the electronic component element housing package of the first embodiment, the bending strength of the ceramic substrate after firing is at least 550 MPa; and the bond strength between the ceramic substrate after firing and the metal layer is at least 25 MPa.

In a third embodiment of the claimed invention, in the electronic component element housing package of the first embodiment, the glass is 1 type selected from among silica ($SiO_2$), magnesia (MgO), calcia (CaO), and titanium oxide ($TiO_2$); and the content level of the glass in the ceramic component is within a range of 5-10% by weight.

In a fourth embodiment of the claimed invention, in the electronic component element housing package of the first embodiment, the glass is 1 type selected from among silica ($SiO_2$), magnesia (MgO), calcia (CaO), and titanium oxide ($TiO_2$); the glass content level in the ceramic component is within a range of 5-10% by weight; and the mole fraction of the yttria in the partially stabilized zirconia is within a range of 0.015-0.035.

According to one or more embodiments of the claimed invention, in an electronic component element housing package, the ceramic substrate contains 10-30% by weight of the partially stabilized zirconia, by forming solid solution with yttria and 1.5-4.5% by weight of a sintering agent comprising magnesia (MgO) and 1 type selected from among silica ($SiO_2$), calcia (CaO), and manganese oxides (MnO, $MnO_2$, $Mn_2O_3$, $Mn_3O_4$), with the remaining portion of alumina ($Al_2O_3$). In addition, the metal layer has 70-94% by weight of tungsten (W), 3-20% by weight of molybdenum (Mo), and 3-20% by weight of a ceramic component of alumina and glass. Requiring a tetragonal phase of at least 60% in the zirconia crystals in the ceramic substrate after simultaneous firing makes it possible to achieve a bending strength of 550 MPa or greater for the ceramic substrate after simultaneous firing and a bond strength of 25 MPa or greater for the ceramic substrate with the metal layers after simultaneous firing. As a result, the ceramic substrate fired after including the sintering agent and the partially stabilized zirconia by forming solid solution with yttria (the ceramic substrate of the first through fourth embodiments of the claimed invention) obtained a higher bending strength than that of a ceramic substrate of alumina fired after adding the sintering agent to the alumina. In addition, having a tetragonal phase of at least 60% in the zirconia crystals makes it possible to increase the strength of ceramic substrate containing high-strength, high-toughness partially stabilized zirconia by transforming a portion of the tetragonal zirconia into monoclinic zirconia at breakage time and causing mass expansion to absorb breakage energy. Although it is generally possible to further increase the bending strength of the ceramic substrate by increasing the content level of the partially stabilized zirconia, when the content ratio of zirconia with its lower thermal conductivity rate than alumina becomes large, the thermal conductivity rate of the ceramic substrate declines, which is not desirable. Accordingly, in the first through fourth embodiments of the claimed invention, by positing a content ratio of 10-30% by weight for the partially stabilized zirconia in the ceramic substrate, approximately the same thermal conductivity ratio can be obtained as with alumina while maintaining a bending strength of at least 550 MPa, which is higher than for alumina.

In accordance with one or more embodiments of the claimed invention, the electronic component element housing package described above contains magnesia as an essential component of the sintering agent in the ceramic substrate, and by adding at least 1 type selected from among silica, calcia, and manganese oxide, glass can be moved from the ceramic substrate to the metal layer by the capillary phenomenon. Also, the glass moved from the ceramic substrate to the metal layer is able to increase the bond strength with the ceramic substrate by producing a physical anchoring effect in the metal layer. Note that if the increase in the content ratio of the sintering agent (comprising magnesia, and at least 1 type selected from among silica, calcia, and manganese oxide) for forming the ceramic substrate is too great, the bending strength of the ceramic substrate itself declines, while if the increase is too small, the bond strength with the metal layer declines, neither of which is desirable. As a result, by positing a content ratio of the sintering agent within a range of 1.5-4.5% by weight in the ceramic substrate, high bending strength for the ceramic substrate itself and high bond strength between the ceramic substrate and the metal layer can be simultaneously secured. Moreover, by positing a mixture in appropriate amounts each for the tungsten and molybdenum in the metal layer in the electronic component element housing package described above in one or more embodiments of the claimed invention, the firing temperature range can be expanded during simultaneous firing of the ceramic substrate and the metal layer in a reducing atmosphere. Finally, by including a ceramic component in the metal layer, the sintering start temperature for the metal layer can be reduced and the shrinkage timing of the metal layer matched to the shrinkage timing of the ceramic, thus making it possible to produce a ceramic substrate provided with a metal layer with reduced warping.

The electronic component element housing package described above may contain no color former such as molybdenum acid or the like to be mixed in to produce a black color in the ceramic substrate. In this case, a white-colored ceramic substrate with a high reflection rate can be achieved due to the high refraction rate of zirconia itself. Consequently, the ceramic substrate can be used in light emitting element packages capable of increasing the reflection rate of light emitted from LEDs (light-emitting diodes) and other light-emitting elements, thereby improving the lighting efficiency.

Other aspects and advantages of the invention will be apparent from the following description and the appended claims.

BRIEF DESCRIPTION OF DRAWINGS

FIG. 1 is a descriptive view of an electronic component element housing package according to one or more embodiments of the claimed invention.

EXPLANATION OF REFERENCE NUMBERS

10 . . . Electronic component element housing package
11 . . . Ceramic substrate
12 . . . Metal layer
13 . . . Electronic component element
14 . . . Cover
15 . . . Bonding wire
16 . . . Wire bond pad
17 . . . Seal pad
18 . . . External connection terminal pad

DETAILED DESCRIPTION

One or more embodiments of the claimed invention will be described in reference to the attached drawings, and will contribute to an understanding of the claimed invention.

FIG. 1 is a descriptive view of an electronic component element housing package in accordance with one or more embodiments of the invention. As shown in FIG. 1, the electronic component element housing package 10 according to one embodiment of the present invention has a ceramic substrate 11 and a metal layer 12 disposed bonded to the ceramic substrate 11. The electronic component element housing package 10 is used to mount an electronic component element 13, such as a semiconductor element, a liquid crystal oscillator, or a light-emitting element, to the ceramic substrate 11, and to hermetically seal the electronic component element 13 with a cover 14. The electronic component element housing package 10 uses a plurality of ceramic green sheets formed into a sheet shape using the doctor blade method, for example, from a slurry made by mixing ceramic powder with an organic binder, a plasticizer, and a solvent or the like in order to create the ceramic substrate 11. In addition, in the ceramic green sheets, the metal layer 12 having a via conductor and a through hole conductor in order to form an electrically conductive state between layers above and below by screen printing a conductive paste is formed. In addition, the plurality of ceramic green sheets on which the printed wiring is formed are formed into the layered ceramic electronic component element housing package 10 by aligning the sheets and applying heat and pressure, after which the ceramic green sheets and printed wiring are simultaneously sintered in a reducing atmosphere, and the metal layers 12 are bonded on the surface and between the layers of the ceramic substrate 11.

The ceramic substrate 11 that is part of the electronic component element housing package 10 described above is made of alumina, partially stabilized zirconia by forming solid solution with yttria, and a sintering agent. The electronic component element housing package 10 has 10-30% by weight of the partially stabilized zirconia by forming solid solution with yttria as described above in the ceramic substrate 11. The partially stabilized zirconia itself has an extremely superlative property of being able to increase strength and toughness. In addition, while increasing the content ratio of partially stabilized zirconia in the ceramic substrate can increase the bending strength of the ceramic substrate 11 itself, the thermal conductivity rate is lower than that of alumina, so adding too much reduces the thermal conductivity of the ceramic substrate 11 itself. Consequently, by positing a content ratio of 10-30% by weight for the partially stabilized zirconia in the ceramic substrate 11, the electronic component element housing package 10 according to the present embodiment is able to have a bending strength higher than a conventional ceramic substrate of alumina and a thermal conductivity rate (15 W/mK) approximately equal to that of a conventional ceramic substrate of alumina. If the content ratio of the partially stabilized zirconia falls below 10%, the post-sintering strengthening effect is insufficient, and only an average bend strength of around 400 MPa can be obtained. Also, if the content ratio for the partially stabilized zirconia exceeds 30% by weight, the thermal conductivity rate drops to 12 W/mK or lower, and it becomes impossible to dissipate the heat from the electronic component elements quickly to the outside via the ceramic substrate 11. Note that even when seam welding is used to hermetically seal the electronic components 13 to the ceramic substrate 11 using the cover 14, a high thermal conductivity rate must be present along with high bending strength because of thermal resistance shock from the high temperature generated at sealing time.

Increasing the content ratio of the partially stabilized zirconia above 30% by weight, however, does not dramatically increase the bending strength of the ceramic substrate 11 described above. In addition, the partially stabilized zirconia by forming solid solution with yttria can be produced using the coprecipitation method, which is one production method for powders. In the coprecipitation method, by adding an alkali to a solution containing at least 2 types of ions to produce a state of oversaturation in which the ion concentration product is greater than the solubility product, a plurality of types of poorly-soluble salts can simultaneously precipitate, making it possible to prepare a powder with a high degree of uniformity, thus exhibiting a property that cannot be obtained simply by pulverizing and mixing a solid specimen. The partially stabilized zirconia by forming solid solution with yttria can be made as a powder with an extremely high degree of uniformity by producing using the coprecipitation method.

In addition, the electronic component element housing package 10 has 1.5-4.5% by weight of magnesia and at least 1 type selected from among silica, calcia, and manganese oxide as a sintering agent in the ceramic substrate. By containing partially stabilized zirconia and magnesia, the ceramic substrate can be made into an elaborate fired body by reducing the firing temperature to around 1450-1600° C., and the thermal conductivity rate can be increased. Furthermore, the reduction in firing temperature is able to inhibit hypertrophic growth of zirconia crystal particles and increase the bond strength between the metal layers 12 and the ceramic substrate 11. If the content ratio of magnesia in the ceramic substrate falls below 0.05% by weight, reducing the firing temperature becomes difficult, and inhibition of hypertrophic growth of the zirconia crystal particles in the ceramic substrate 11 becomes impossible. As a result, an elaborate fired body cannot be obtained. Also, if the content ratio of magnesia exceeds 1% by weight in the ceramic composite, there is no noticeable change in the sintering properties, the bend strength of the ceramic substrate 11 declines. Moreover, by including a sintering agent having at least 1 type selected from among silica, calcia, and manganese oxide in the ceramic composite, it is possible to move the glass in the ceramic substrate 11 to the metal layers 12 by the capillary phenomenon, where the physical anchoring effect of the glass increases the bond strength between ceramic substrate 11 and the metal layers 12. If the content ratio of the sintering agent falls below 1.5% by weight in the ceramic composite, the amount of glass moving from the ceramic substrate 11 to the metal layers 12 is insufficient, and the bond strength between the ceramic substrate 11 and the metal layers 12 declines. Also, if the content ratio of the sintering agent exceeds 4.5% by weight in the ceramic substrate, there will be too much glass in the ceramic substrate 11, and the bending strength of the ceramic substrate 11 declines.

In a later paragraph, manganese oxide in which the chemical formula is shown as $Mn_2O_3$ is used as an example. However, it is also possible to utilize as a sintering agent in place of this manganese oxide ($Mn_2O_3$) a different manganese oxide with a different chemical formula (such as MnO, $MnO_2$, or $Mn_3O_4$) alone, or a plurality of combinations of a plurality of types of manganese oxides with differing chemical formulas in accordance with one or more embodiments of the invention.

Apart from having 10-30% by weight of the partially stabilized zirconia and 1.5-4.5% by weight of the sintering agent in the ceramic substrate 11, the remaining portion of the electronic component element housing package 10 contains alumina. Consequently, the content ratio of alumina in the ceramic substrate 11 that is part of the electronic component element housing package 10 is a maximum of 88.5% and a minimum of 65.5%. If the content ratio of alumina in the ceramic substrate 11 falls within this range, the thermal conductivity can be maintained at around the same level as an alumina substrate according to conventional technology (ceramic substrate of a ceramic composite of alumina: 91-94% by weight and sintering agent: 6-9% by weight), and the thermal conductivity rate of the ceramic substrate 11 can be kept from dropping, even when a zirconia additive is present as a thermal conductivity lowering material.

In the electronic component element housing package 10 described above, a metal layer bonded to the ceramic substrate 11 contains tungsten, molybdenum, and a ceramic component. The metal layer contains 70-94% by weight of tungsten, 3-20% by weight of molybdenum, and 3-20% by weight of the ceramic component. In addition, printed wiring is formed on the ceramic green sheets by a screen printer using a conductive paste containing a binder and a solvent. Then, the ceramic green sheets are formed by simultaneous firing in a reducing atmosphere in order to dispose the metal layer 12 in the ceramic substrate 11. The tungsten and molybdenum in the metal layer both are metals with high melting points (tungsten melting point: 3,407° C., molybdenum melting point: 2,620° C.), and conventionally are widely known as conducting metals capable of simultaneous firing with ceramics in a reducing atmosphere.

By including the optimal amount of molybdenum in the metal layer described above, the simultaneous firing temperature range can be lowered and made broader (1450-1600° C.) than when only tungsten is used as a conductor metal in the metal layer, taking advantage of the fact that molybdenum has a lower melting point than the melting point of tungsten. As a result, the metal layer 12 is rendered so that simultaneous firing is possible with the ceramic substrate 11, the lowering of the firing temperature of which is enabled by including the partially stabilized zirconia. In addition, because the metal layer is made up of a plurality of types of conductor metals, simultaneous firing adapted to the content volume of alumina is possible. In other words, simultaneous firing is possible without any difficulty by broadening the range of metal layer firing temperatures by adding molybdenum, even when the content volume of alumina in the ceramic substrate changes and the appropriate firing temperature changes.

Furthermore, by simultaneously firing the metal layer and the ceramic substrate, the metal layer described above is capable of having strong inter-particle bonds by incorporating the glass component in the ceramic substrate around the tungsten particles and molybdenum particles. Additionally, the metal layer described above is able to tightly bond together the ceramic substrate 11 and the metal layer 12 by simultaneous firing while siphoning off the glass component in the ceramic green sheets, taking advantage of molybdenum's superior wettability to glass.

Also, by including the optimal amount of the ceramic component in the metal layer, it is possible to perform firing while supplementing the glass component to the ceramic green sheets and increase the bond strength between the ceramic substrate 11 and the metal layer 12 after simultaneous firing. In addition, by including the ceramic component in the metal layer, it is possible to prevent the peeling away of metal layer 12 from the ceramic substrate 11 that occurs due to a shrinkage differential during simultaneous firing of the ceramic green sheets, and conductive paste filled in the via of the ceramic green sheets. Furthermore, by including the ceramic component in the metal layer, it is possible to inhibit the occurrence of warping of the ceramic substrate 11 on which the metal layer is disposed by matching the amount of time for firing shrinkage of the ceramic substrate 11 and the metal layer 12, advancing the firing shrinkage start timing to approach that of the ceramic. The ceramic component is a combination of at least one type of glass selected from among silica ($SiO_2$), magnesia (MgO), calcia (CaO), and titanium oxide ($TiO_2$) with alumina. The glass content ratio in the ceramic component preferably should be within the range of 5-10% by weight.

In accordance with one or more embodiments, the metal layer is configured to provide electrical conductivity by including at least 80% by weight of conductive metal combining the comparatively low-conductivity tungsten and molybdenum. Also, if the content ratio of molybdenum exceeds 20% by weight, the firing temperature is lowered too far, and the simultaneous firing with the ceramic green sheets becomes difficult. In addition, if the content ratio of tungsten exceeds 94% by weight, the content ratio of at least one of molybdenum or the ceramic component drops below 3% by weight. Furthermore, if the content ratio of molybdenum drops below 3% by weight, lowering the firing temperature becomes difficult, and simultaneous firing with the ceramic green sheets becomes impossible. In addition, if the content ratio of the ceramic component drops below 3% by weight, the glass component volume in the metal layer 12 is insufficient, the anchoring effect to the ceramic substrate 12 is reduced, and the bonding strength declines. Moreover, if the content ratio of the ceramic component exceeds 20% by weight, problems occur in that the glass component becomes too prevalent and conversely, the internal strength of the metal layer 12 declines, the electrical resistance value as a conductor increases, and the seal strength with plated films declines.

The electronic component element has a tetragonal phase of at least 60% of the zirconia crystals in the ceramic substrate 11 after simultaneous firing. The zirconium oxide ($ZrO_2$) itself that is part of the partial stabilized zirconia contained in the ceramic substrate 11 has properties of high thermal tolerance, low vapor pressure at high temperatures, good chemical corrosion resistance, and a thermal conductivity rate lower than that of alumina by at least 1 decimal place, and is especially outstanding as a high-heat resistant material. However, zirconium oxide has three transformations: monoclinic, tetragonal, and cubical, and because the phase transformation between monoclinic and tetragonal in particular is accompanied by a significant change of mass, it is impossible to use pure zirconium oxide as a high-heat resistant material. Accordingly, when zirconium oxide forms solid solution with low molecular value oxide such as yttria, it is possible to form a stabilized zirconia in which fluorite type cubical, which is the highest temperature phase, exists as a stable phase to low temperatures. The amount of yttria additive required for 100% cubical stabilized zirconia is about 6% by mole. By adding less than that amount, for example, 3% by mole, or more specifically, by positing a mole fraction of a range of 0.015-0.035 for yttria in the partially stabilized zirconia, it is possible to form partially stabilized zirconia in mixed phases of cubical and tetragonal, cubical and monoclinical, and tetragonal and monoclinical, or in single phase tetragonal. Consequently, the electronic component element housing package 10 having a ceramic substrate 11 containing zirconia partially stabilized by forming solid solution with yttria, having a tetragonal crystal percentage among the zirconia crystals of at least 60%, has the excellent properties of being able to increase the bending strength and increase the toughness. As a result, since the ceramic substrate 11 that is part of the electronic component element housing package 10 can be made thinner, the electronic component item housing package 10 can be made into a package capable of supporting extremely small and low-profile applications. If the percentage of tetragonal drops below 60% in the zirconia crystals that are part of the ceramic substrate 11, the bending strength of the electronic component element housing package having the ceramic substrate 11 declines, the toughness also declines, and making a thin ceramic substrate becomes difficult.

In addition, the electronic component element housing package 10 described above has a bending strength of 550 MPa or greater for the ceramic substrate 11 after simultaneous firing. The electronic component element housing package 10 having a bending strength of 550 MPa or greater is capable of bonding the electronic component element 13 mounted on the ceramic substrate 11 without causing cracks or breaks in the ceramic substrate 11, even when sealed by the metallic cover 14 while applying pressure by seam welding or the like. The bending strength is measured using the test method of JIS R 1601. Consequently, with this ceramic substrate 11, an electronic component element housing package having a thickness thinner than a conventional ceramic substrate can be provided, and the package and the electronic devices incorporated therein can be adapted to demands for smaller size and lower profile.

Furthermore, the electronic component element housing package 10 described above has a bond strength of 25 MPa or more for the ceramic substrate 11 and the metal layer 12 after simultaneous firing. The electronic component element housing package 10 having a bond strength of 25 MPa or more for the ceramic substrate 11 and the metal layer 12 is capable of bonding to the metal layer 12 a wire bond pad 16 for creating an electrical connection state between the electronic component element 13 and the bonding wire 15, a seal pad for bonding the cover 14, and an external connection terminal pad 18 for creating an electrically connected state via solder bond with the external circuits. The bond strength was measured by performing AgCu braising a metal lead terminal bent at a right angle to the 1 mm wide metal layer 12, pulling the metal terminal in the vertical direction, and measuring the strength assuming that the metal layer 12 has peeled away from the surface of the ceramic substrate 11.

Working Example 1

The inventor of the invention in the present application created samples of a ceramic substrate of alumina, and of alumina and zirconia partially stabilized by forming solid solution with yttria in component ratios of 95:5, 90:10, 80:20, and 70:30, and measured the bending strength of each ceramic substrate. The inventor also formed a metal layer on each of the ceramic substrates above with 94% by weight of tungsten, 3% by weight of molybdenum, and 3% by weight of a ceramic component, and measured the bond strength between the ceramic substrate and the metal layer. Table 1 shows the results thereof. As shown in Table 1, it is confirmed that if the partially stabilized zirconia by forming solid solution with yttria is present at a rate of 10% by weight or greater, bending strength of 550 MPa or greater can be obtained. However, it is refer to the detail below confirmed that the bond strength between the ceramic substrate and the metal layer is under 10 MPa in every case, and thus there is almost no bond strength.

In other words, it is clear that leaving out the sintering agent from the ceramic substrate 11 makes it completely impossible to secure bond strength for the metal layer 12. As a result, the sintering agent in the ceramic substrate in the invention of the present application is an essential component element for the invention of the present application to achieve a distinctive effect.

TABLE 1

| Alumina | Partially Stabilized Zirconia by forming solid solution with yttria | Bending Strength (MPa) | Metalized Layer Bond Strength (MPa) |
| --- | --- | --- | --- |
| 100 |    | 300 | <10 |
| 95  | 5  | 400 | <10 |
| 90  | 10 | 550 | <10 |
| 80  | 20 | 700 | <10 |
| 70  | 30 | 750 | <10 |

Working Example 2

Next, the inventor of the present application produced ceramic substrates having a component percentage of 22% by weight for partially stabilized zirconia by forming solid solution with yttria, 0.5% by weight of magnesia, and a total content level of 0.5-6.0% by weight of a sintering agent having at least 1 type selected from among silica, calcia, and manganese oxide, with the remaining portion of alumina, and measured the bending strength of the ceramic substrates. In addition, the inventor formed a metal layer on each of the ceramic substrates above with 94% by weight of tungsten, 3% by weight of molybdenum, and 3% by weight of a ceramic component, and measured the bond strength between the ceramic substrate and the metal layer. Table 2 shows the results thereof. As shown in Table 2, it is confirmed that the working example having a content level of 1.5-4.5% by weight of the sintering agent having a combination of at least 1 type selected from among silica, calcia, and manganese oxide was able to secure a bond strength of 25 MPa or greater between the ceramic substrate and the metal layer. In addition, it is confirmed that a comparative example with a component percentage of 22% by weight for the partially stabilized zirconia by forming solid solution with yttria and 0.5% by weight for the magnesia only, and a comparative example with a component percentage of 22% by weight for the partially stabilized zirconia by forming solid solution with yttria and 0.5% by weight for the magnesia, and a total content level of under 1.5% by weight of a sintering agent having at least 1 type selected from among silica, calcia, and manganese oxide were able to secure a bending strength of 550 MPa or greater for the ceramic substrate, but exhibited a bond strength between the ceramic substrate and the metal layer of under 10 MPa, and thus were unable to secure a metalized layer bond strength of 25 MPa or greater. In addition, it is confirmed that a comparative example having a component percentage of 22% by weight for the partially stabilized zirconia by forming solid solution with yttria and 0.5% by weight for magnesia, and a total content level of over 4.5% by weight of a sintering agent having at least 1 type selected from among silica, calcia, and manganese oxide was able to obtain a bond strength between the ceramic substrate and the metal layer of 25 MPa or greater, but exhibited a bending strength of under 500 MPa, and thus was unable to secure a bending strength of 550 MPa or greater.

In the samples for each of the working examples shown in Table 2 below, material with a chemical formula of $Mn_2O_3$ is used as manganese oxide.

As discussed above, in the invention of the present application, the content level and the component composition of the sintering agent are essential elements in the ceramic substrate.

zirconia and 7% by weight of the sintering agent of magnesia and silica and calcia, with the remaining portion of alumina, and measured the reflection rate of blue light with a wavelength of 450 nm under the same conditions, the reflection rate of the sample surface was 75%.

The thickness of the sample ceramic substrate in the working example and the conventional example used for measuring the reflection rate was 1 mm.

Therefore, the electronic component element housing package 10 according to the present embodiment has significantly greater reflectivity than the conventional example, and if the electronic component element mounted on the electronic component element housing package 10 is a light-emitting element, the ceramic substrate 10 itself can be made to function adequately as reflective material.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

INDUSTRIAL UTILITY

Because the electronic component element housing package of the present invention is capable of supporting a lower profile, it can be incorporated for use in electronic devices

TABLE 2

|  | Alumina (wt %) | Partially Stabilized Zirconia by forming solid solution with yttria (wt %) | Magnesia (wt %) | Silica (wt %) | Calcia (wt %) | Manganese Oxide (wt %) | Bending Strength (MPa) | Metalized Layer Bond Strength (MPa) |
|---|---|---|---|---|---|---|---|---|
| Working Examples | 76.5 | 22 | 0.75 |  | 0.75 |  | 650 | 25 |
|  | 76.5 | 22 | 0.5 | 1.0 |  |  | 650 | 25 |
|  | 76.5 | 22 | 0.5 |  |  | 1.0 | 630 | 25 |
|  | 76.0 | 22 | 0.5 | 1.0 | 0.5 |  | 700 | 25 |
|  | 75.5 | 22 | 0.5 | 1.5 | 0.5 |  | 680 | 30 |
|  | 75.0 | 22 | 0.5 | 2.0 | 0.5 |  | 600 | 30 |
|  | 74.5 | 22 | 0.5 | 2.5 | 0.5 |  | 580 | 30 |
|  | 73.5 | 22 | 0.5 | 3.5 | 0.5 |  | 550 | 30 |
|  | 76.0 | 22 | 0.5 | 0.5 | 0.5 | 0.5 | 700 | 25 |
|  | 75.0 | 22 | 0.5 | 1.0 | 0.5 | 1.0 | 650 | 30 |
|  | 74.0 | 22 | 0.5 | 1.5 | 0.5 | 1.5 | 600 | 30 |
|  | 73.5 | 22 | 0.5 | 1.5 | 0.5 | 2.0 | 580 | 30 |
| Comparative Examples | 77.5 | 22 | 0.5 |  |  |  | 700 | <10 |
|  | 77.0 | 22 | 0.5 | 0.5 |  |  | 700 | <10 |
|  | 72.5 | 22 | 0.5 | 4.5 | 0.5 |  | 500 | 30 |
|  | 72.0 | 22 | 0.5 | 5.0 | 0.5 |  | 300 | 30 |
|  | 72.5 | 22 | 0.5 | 1.5 | 0.5 | 3.0 | 500 | 30 |

In addition, the inventor produced a sample of a working example having in the ceramic composite 22% by weight of partially stabilized zirconia, 0.5% by weight of magnesia, 1.0% by weight of silica, 0.5% by weight of calcia, and 1.0% by weight of manganese oxide ($Mn_2O_3$), with the remaining portion of alumina, and upon measuring the reflection rate of blue light with a wavelength of 450 nm as expected from mounting onto the electronic component element housing package according to the present embodiment, the sample surface reflection rate was 83%. In measuring the reflected light, a Konica Minolta spectrophotometer (CM-3700d) was used, and the measuring conditions were SCI (including regular reflection) and an area of ϕ8 mm.

However, when the inventor produced a sample of a conventional example (comparative example) having in the ceramic substrate 22% by weight of the partially stabilized such as personal computers and mobile telephones in which thinness and small size is required, after electronic component elements such as semiconductor elements and liquid crystal oscillators adapted to have reduced size and profile are mounted in a mounting location cavity and sealed with a cover. In addition, the electronic component element housing package of the present invention can be used as backlighting by mounting an electronic component element such as a light-emitting element in lighting equipment for which thinness and small size is required, as well as in televisions and personal computers.

What is claimed:
1. An electronic component element housing package, wherein the package is produced by firing a non-sintered ceramic substrate for housing an electronic component element and a non-sintered metal layer for bonding to the ceramic substrate to form an electrical path, simultaneously in a reducing atmosphere;

wherein the package comprises layered ceramics, in which the metal layer is bonded on the ceramic substrate;

wherein the ceramic substrate comprises alumina ($Al_2O_3$), a partially stabilized zirconia by forming solid solution with yttria ($Y_2O_3$) and a sintering agent;

wherein the sintering agent comprises magnesia (MgO), and at least 1 type selected from silica ($SiO_2$), calcia (CaO), or manganese oxides (MnO, $MnO_2$, $Mn_2O_3$, $Mn_3O_4$);

wherein the content level of the partially stabilized zirconia in the ceramic substrate is within a range of 10-30% by weight;

wherein the mole fraction of the yttria in the partially stabilized zirconia is within a range of 0.015-0.035;

wherein the content level of the sintering agent in the ceramic substrate is within a range of 1.5-4.5% by weight;

wherein the residual portion other than the partially stabilized zirconia and the sintering agent in the ceramic substrate is the alumina;

wherein the metal layer comprises tungsten (W), molybdenum (Mo), and a ceramic component having glass and alumina;

wherein the content level of the tungsten in the metal layer is within a range of 70-94% by weight;

wherein the content level of the molybdenum in the metal layer is within a range of 3-20% by weight;

wherein the content level of the ceramic component in the metal layer is within a range of 3-20% by weight; and wherein at least 60% of zirconia crystals in the ceramic substrate after firing is in tetragonal phase.

2. The electronic component element housing package of claim 1, wherein the bending strength of the ceramic substrate after firing is at least 550 MPa; and wherein the bond strength between the ceramic substrate after firing and the metal layer is at least 25 MPa.

3. The electronic component element housing package of claim 1, wherein the glass is at least 1 type selected from among silica ($SiO_2$), magnesia (MgO), calcia (CaO), and titanium oxide ($TiO_2$); and wherein the content level of the glass in the ceramic component is within a range of 5-10% by weight.

* * * * *